United States Patent [19]

Tsukagoshi et al.

[11] Patent Number: 6,072,333
[45] Date of Patent: Jun. 6, 2000

[54] TRISTATE OUTPUT CIRCUIT

[75] Inventors: Kunihiko Tsukagoshi; Satoru Miyabe; Kazuhisa Oyama, all of Tokyo, Japan

[73] Assignee: Nippon Precision Circuits, Inc., Tokyo, Japan

[21] Appl. No.: 09/185,773

[22] Filed: Nov. 4, 1998

[30] Foreign Application Priority Data

Nov. 10, 1997 [JP] Japan ..................................... 9-307002

[51] Int. Cl.[7] ...................... H03K 19/00; H03K 19/0175
[52] U.S. Cl. .................. 326/58; 325/58; 325/57; 325/26; 325/27; 325/81; 325/83; 325/86; 325/87
[58] Field of Search ................................ 326/26, 27, 56, 326/57, 58, 81, 83, 86, 87

[56] References Cited

U.S. PATENT DOCUMENTS

| | | |
|---|---|---|
| 4,980,579 | 12/1990 | McDonald et al. . |
| 5,153,450 | 10/1992 | Ruetz ..................................... 307/443 |
| 5,448,181 | 9/1995 | Chiang . |
| 5,539,335 | 7/1996 | Kobayashi et al. ........................ 326/81 |
| 5,559,464 | 9/1996 | Orii et al. ................................ 327/333 |
| 5,973,509 | 10/1999 | Tanigushi et al. ........................ 326/81 |

*Primary Examiner*—Michael Tokar
*Assistant Examiner*—Vibol Tan
*Attorney, Agent, or Firm*—Fish & Richardson P.C.

[57] ABSTRACT

The drains of P- and N-channel MOS transistors 1 and 2 are connected to each other. An output terminal is formed at the node of the drains. Each of first and second amplifier stages 4 and 5 is configured by cascading an n number of CMOS inverters. The amplifier stages drive first and second last-stage CMOS inverters 6 and 7 to drive the P- and N-channel MOS transistors 1 and 2, respectively. A dummy CMOS inverter 8 is disposed so that the input is connected to the node of the second amplifier stage 5 and the second last-stage CMOS inverter 7. The load of the second amplifier stage 5 is equal to that of the first amplifier stage 4. The drivabilities of the CMOS inverters of the same stage in the first and second amplifier stages 4 and 5 are made equal to each other. According to this configuration, the number of CMOS inverters which must be checked in a process of adjusting the duty can be reduced.

7 Claims, 3 Drawing Sheets

TRISTATE OUTPUT CIRCUIT

BACKGROUND OF THE INVENTION

1. Field of the Invention

The present invention relates to a tristate output circuit.

2. Related art

At present, a MOS structure semiconductor device uses a tristate output circuit such as that shown in FIG. 3. The tristate output circuit comprises: a control unit 36 consisting of transmission gates 31 and 32, a control inverter 33 for the transmission gates 31 and 32, and a P-channel MOS transistor 34 and an N-channel MOS transistor 35 which respectively control the logic levels of output terminals out1 and out2 of the transmission gates 31 and 32; amplifier stages 37 and 38 in which CMOS inverters of the same number are cascaded and which respectively amplify signals from the output terminals out1 and out2 of the transmission gates 31 and 32; and an output stage 312 which has a P-channel MOS transistor 39 receiving at the gate an output of the amplifier stage 37, and an N-channel MOS transistor 310 receiving at the gate an output of the amplifier stage 38, and in which the drains of the transistors are connected to each other and the node is used as an output terminal 311. In each of the amplifier stages 37 and 38, plural CMOS inverters which respectively drive the subsequent stage and which have different drivabilities are cascaded in ascending order of drivability, and the states of the output terminals out1 and out2 are sequentially amplified to a level at which the P-channel MOS transistor 39 and the N-channel MOS transistor 310 that have high drivability can be driven. In this example, six CMOS inverters are cascaded.

In such a tristate output circuit, a first or second logic level, i.e., "H" or "L" is generated at the output terminal 311 in the following manner. The P-channel MOS transistor 34 and the N-channel MOS transistor 35 are turned OFF. A terminal 313 is set to be "H" so that the transmission gates 31 and 32 are opened. Signals which are in phase with each other are applied to input terminals in1 and in2 of the transmission gates 31 and 32, respectively. The signals at the input terminals in1 and in2 are amplified by the amplifier stages 37 and 38, and then applied to the P-channel MOS transistor 39 and the N-channel MOS transistor 310, respectively. These transistors are complementarily turned ON and OFF so that the output terminal 311 is set to be "H" or "L."

The terminal 313 is set to be "L" so that the transmission gates 31 and 32 are closed. The P-channel MOS transistor 34 and the N-channel MOS transistor 35 are turned ON. As a result, both the P-channel MOS transistor 39 and the N-channel MOS transistor 310 are turned OFF, and the output terminal 311 is set to be floating, thereby attaining a high impedance.

With respect to the P-channel MOS transistor 39 and the N-channel MOS transistor 310, as carriers, the former uses holes and the latter uses electrons. The mobility of a hole is inferior to that of an electron. In order to equalize the drivability of the P-channel MOS transistor to that of the N-channel MOS transistor, therefore, the size of the P-channel MOS transistor 39 must be larger than that of the N-channel MOS transistor 310 (for example, the gate is made larger). As a result, the gate capacitance of the P-channel MOS transistor 39 which is a load of a CMOS inverter 314 is larger than that of the N-channel MOS transistor 310 which is a load of a CMOS inverter 315. Therefore, the load of CMOS inverter 314 is larger than that of the CMOS inverter 315. When the two CMOS inverters are configured so as to have the same drivability, the response characteristics of the CMOS inverter 314 is inferior to those of the CMOS inverter 315. In order to drive the two CMOS inverters with the same response characteristics, therefore, the drivability of the CMOS inverter 314 which drives the P-channel MOS transistor 39 must be higher than that of the CMOS inverter 315 which drives the N-channel MOS transistor 310. In other words, the CMOS inverter 314 must be configured by MOS transistors which are larger in size than MOS transistors constituting the CMOS inverter 315.

Consequently, the CMOS inverters constituting the amplifier stages 37 and 38 have different drivabilities, or have different sizes.

A tristate output circuit is configured so that, when a clock signal consisting two states of "H" and "L" is to be generated as required, an output of an appropriate duty is obtained. In the tristate output circuit described above, however, the process of adjusting the duty is cumbersome because the CMOS inverters constituting the amplifier stages 37 and 38 are different in size from each other. Namely, when an output of a desired duty cannot be obtained after integration, the CMOS inverters of the amplifier stages 37 and 38 must be individually proved to check their outputs, thereby identifying a problematic portion. Furthermore, it is difficult to change the design because the CMOS inverters have different sizes.

SUMMARY OF THE INVENTION

In the invention, therefore, first and second MOS transistors of different conductive types which are connected at the drain to each other are driven by first and second last-stage CMOS inverters driven by first and second amplifier stages, respectively, an output terminal is formed at the node of the drains, an input of a dummy CMOS inverter is connected to a node of the second amplifier stage and the second last-stage CMOS inverter, the load of the second amplifier stage constituted by the second last-stage CMOS inverter and the dummy CMOS inverter is equal to the load of the first amplifier stage constituted by the first last-stage CMOS inverter, and a ratio of the drivability of the first last-stage CMOS inverter to that of the second last-stage CMOS inverter is equal to a ratio of drivabilities of signals which are required for respectively driving the first and second MOS transistors, whereby drivabilities of the CMOS inverters of the same stage in the first and second amplifier stages are made equal to each other.

According to this configuration, the number of CMOS inverters which must be checked in a process of adjusting the duty is reduced. Specifically, checks on each stages of the first and second amplifier stages are not required and a problematic portion can be identified by conducting checks only on the rear stages of the first and second amplifier stages. Moreover, the design can be easily changed.

An aspect of the present invention, there is provided a tristate output circuit comprising an output stage in which a drain of a first MOS transistor of a first conductive type and a drain of second MOS transistor of a second conductive type are connected to each other, and an output terminal is disposed at a node of the drains, the second MOS transistor being able to be driven by a signal that is lower in drivability than a signal by which the first MOS transistor is able to be driven; a first amplifier stage in which an n number of CMOS inverters (n is an integer of 2 or more) having different drivabilities are cascaded in ascending order of drivability; a second amplifier stage in which an n number of CMOS inverters having different drivabilities are cascaded in ascending order of drivability and the drivability of a CMOS inverter of each stage is set to be equal to that of a CMOS inverter of the corresponding stage of the first amplifier stage; a first last-stage CMOS inverter which is connected between the first amplifier stage and the first MOS transistor and, in response to an output from the first amplifier stage, drives the first MOS transistor; a second last-stage CMOS inverter which is connected between the second amplifier stage and the second MOS transistor and, in response to an output from the second amplifier stage, drives the second MOS transistor; a dummy CMOS inverter having an input which is connected to a node of the second amplifier stage and the second last-stage CMOS inverter; and a control circuit which controls signals respectively supplied to the first and second amplifier stages to set a state of the output terminal of the output stage to be a first logic level, a second logic level, or a high impedance, a load of the second amplifier stage constituted by the second last-stage CMOS inverter and the dummy CMOS inverter being equal to a load of the first amplifier stage constituted by the first last-stage CMOS inverter, a ratio of the drivability of the first last-stage CMOS inverter to the drivability of the second last-stage CMOS inverter being equal to a ratio of drivabilities of signals which are required for respectively driving the first and second MOS transistors.

Preferably, the first MOS transistor is a P-channel MOS transistor, and the second MOS transistor is an N-channel MOS transistor.

Preferably, a sum of gate widths of MOS transistors constituting the second last-stage CMOS inverter and gate widths of MOS transistors constituting the dummy CMOS inverter is equal to a gate width of an MOS transistor constituting the first last-stage CMOS inverter.

Preferably, the first MOS transistor is a P-channel MOS transistor, and the second MOS transistor is an N-channel MOS transistor, and a sum of a gate width of an N-channel MOS transistor constituting the second last-stage CMOS inverter and a gate width of an N-channel MOS transistor constituting the dummy CMOS inverter is equal to a gate width of an N-channel MOS transistor constituting the first last-stage CMOS inverter.

Preferably, the second last-stage CMOS inverter and the dummy CMOS inverter share one P-channel MOS transistor, the N-channel MOS transistors of the inverters share a source and a gate, only a drain of the N-channel MOS transistor of the second last-stage CMOS inverter is connected to a drain of the shared P-channel MOS transistor, a drain of the N-channel MOS transistor of the dummy CMOS inverter is set to be floating, the shared P-channel MOS transistor is equal in size to the P-channel MOS transistor of the first last-stage CMOS inverter, and the N-channel MOS transistors of the second last-stage CMOS inverter and the dummy CMOS inverter being formed by dividing a drain of a N-channel MOS transistor which is equal in size to the N-channel MOS transistor of the first last-stage CMOS inverter.

Preferably, drivability of the second last-stage CMOS inverter is set by a ratio of the drain division.

DETAILED DESCRIPTION OF THE PREFERRED EMBODIMENTS

Hereinafter, a tristate output circuit which is an embodiment of the invention will be described.

Figure 1:
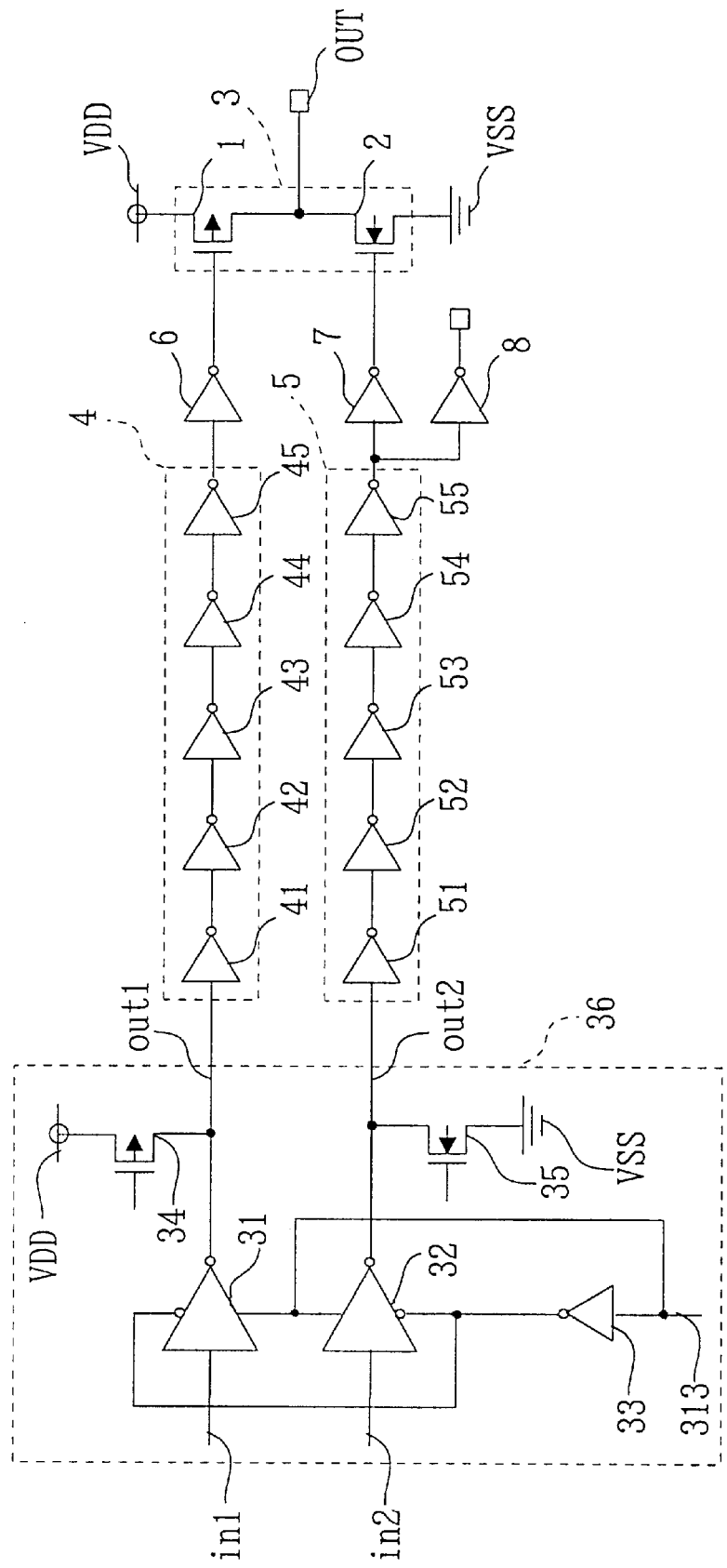
FIG. 1 is a diagram illustrating the configuration of a tristate output circuit which is an embodiment of the invention.

First, the configuration of the embodiment will be described with reference to FIG. 1. In the figure, the reference numeral 1 designates a P-channel MOS transistor, and the reference numeral 2 designates an N-channel MOS transistor. The drains of these transistors are connected to each other, and an output terminal OUT is disposed at the node, thereby configuring an output stage 3.

The reference numerals 4 and 5 respectively designate first and second amplifier stages in each of which five CMOS inverters are cascaded in ascending order of drivability. That is, each amplifier stages comprise stages of CMOS inverters. In the embodiment, five CMOS inverters are cascaded so as to constitute each amplifier stage. The number of CMOS inverters is not restricted to this. The first and second amplifier stages 4 and 5 drive the P-channel MOS transistor 1 and the N-channel MOS transistor 2 via first and second last-stage CMOS inverters which will be described later. Therefore, an appropriate number of CMOS inverters may be used in accordance with the sizes of the P-channel MOS transistor 1 and the N-channel MOS transistor 2. In the first and second amplifier stages 4 and 5, the CMOS inverters of the same stage are set to have the same drivability. For example, CMOS inverters 41 to 45 are identical with CMOS inverters 51 to 55, respectively.

The reference numeral 6 designates the first last-stage CMOS inverter which receives an output of the first amplifier stage 4 and drives the P-channel MOS transistor 1.

The reference numeral 7 designates the second last-stage CMOS inverter which receives an output of the second amplifier stage 5 and drives the N-channel MOS transistor 2.

The reference numeral 8 designates a dummy CMOS inverter in which the input is connected to the node of the second amplifier stage 5 and the second last-stage CMOS inverter 7.

The reference numeral 36 designates a control circuit which is identical with that used in the above-described tristate output circuit of the prior art, and which controls signals respectively supplied to the first and second amplifier stages 4 and 5 to set the state of the output terminal of the output stage 3 to be "H," "L," or a high impedance. In other words, the tristate output operation of the embodiment is the same as that of the prior art described above, and hence the operation is not described in detail.

In the embodiment, the load of the second amplifier stage 5 constituted by the second last-stage CMOS inverter 7 and the dummy CMOS inverter 8 is set to be equal to the load of the first amplifier stage 4 constituted by the first last-stage CMOS inverter 6, and a ratio of the drivability of the first last-stage CMOS inverter 6 to that of the second last-stage CMOS inverter 7 is set to be equal to a ratio of drivabilities of signals which are required for respectively driving the P-channel MOS transistor 1 and the N-channel MOS transistor 2, or, i.e., a ratio of the loads by the transistors. When the load constituted by the P-channel MOS transistor 1 is $W_P$, the load constituted by the N-channel MOS transistor 2 is $W_N$, and the drivabilities of the first last-stage CMOS inverter 6, the second last-stage CMOS inverter 7, and the dummy CMOS inverter 8 are $X_6$, $X_7$, and $X_8$, respectively, this setting can be expressed in the following relationship:

$$X_7 : X_8 = (W_N/W_P) X_6 : (1-(W_N/W_P)) X_6$$

The drivabilities $X_6$, $X_7$, and $X_8$ are proportional to the sizes of the first and second last-stage CMOS inverters 6 and 7 and the dummy CMOS inverter 8, particularly to the gate widths of MOS transistors constituting the inverters, respectively. The above-mentioned setting can be realized by setting the gate widths of the transistors in accordance with the relationship above.

Specifically, a sum of the gate widths of MOS transistors constituting the second last-stage CMOS inverter 7 and those of MOS transistors constituting the dummy CMOS inverter 8 is made equal to the gate width of an MOS transistor constituting the first last-stage CMOS inverter 6, whereby the load of the second amplifier stage 5 constituted by the second last-stage CMOS inverter 7 and the dummy CMOS inverter 8 can be set to be equal to the load by the first amplifier stage 4 constituted by the first last-stage CMOS inverter 6. When the ratio of the gate width (so called, the channel width) of a MOS transistor constituting the second last-stage CMOS inverter 7 to the gate width of a MOS transistor constituting the dummy CMOS inverter 8 is appropriately set in accordance with the relationship above, a ratio of the drivability of the first last-stage CMOS inverter 6 to that of the second last-stage CMOS inverter 7 can be set to be equal to a ratio of the loads of the P-channel MOS transistor 1 and the N-channel MOS transistor 2.

The drivability of a CMOS inverter which drives an N-channel MOS transistor depends on the gate width of an N-channel MOS transistor constituting the inverter. Consequently, with respect to the drivability of the second last-stage CMOS inverter 7, required drivability can be set by setting only the size of the N-channel MOS transistor.

Figure 2:
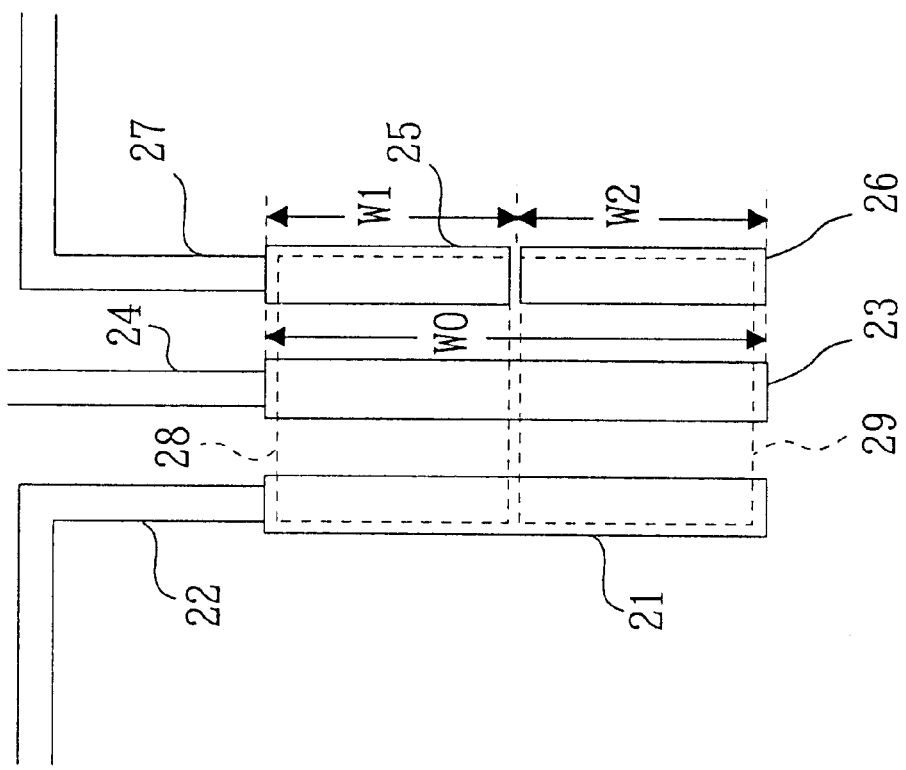
FIG. 2 is a plan view illustrating main portions of FIG. 1.
Figure 3:
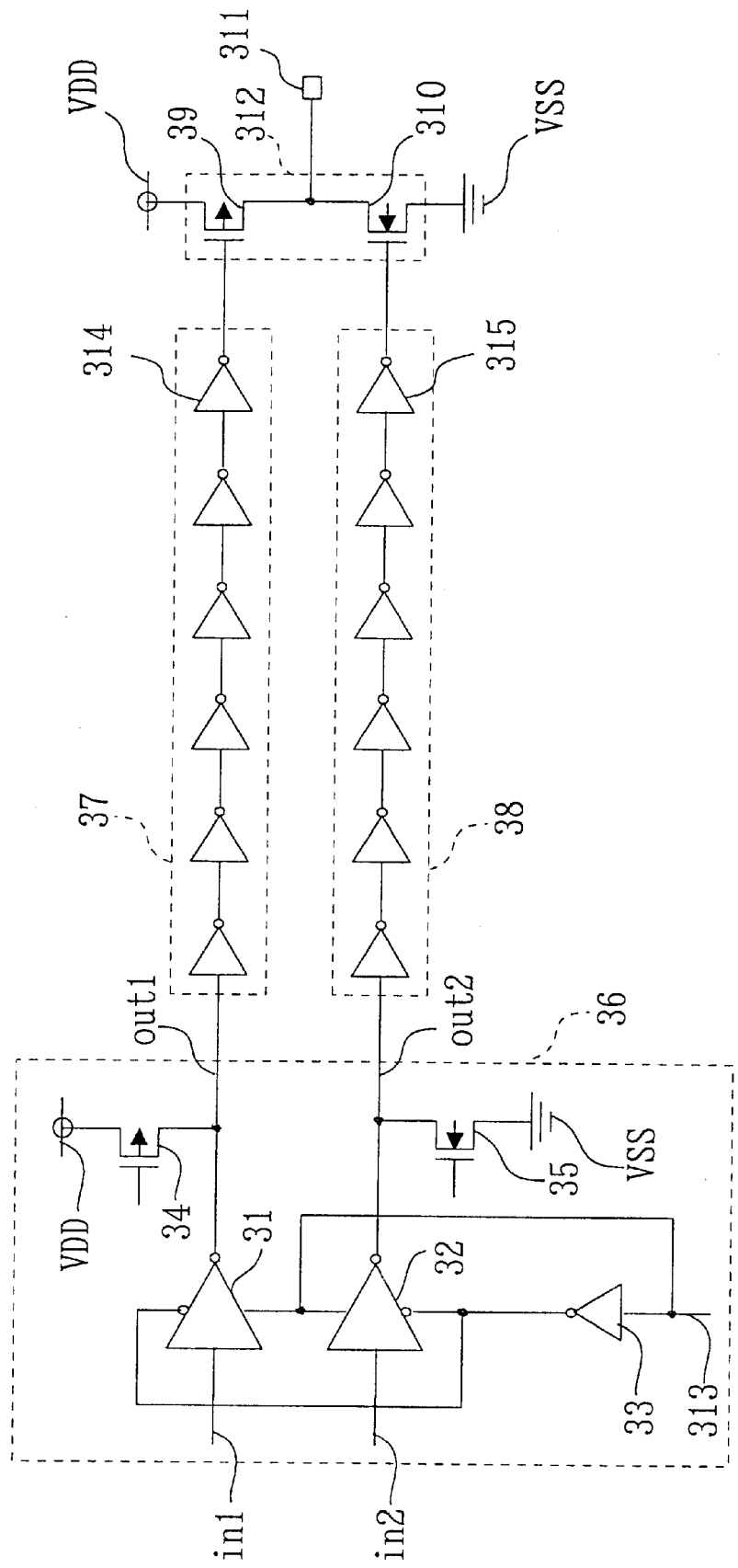
FIG. 3 is a diagram illustrating the configuration of a tristate output circuit of the conventional art.

In the embodiment, therefore, the N-channel MOS transistor of each of the second last-stage CMOS inverter 7 and the dummy CMOS inverter 8 is configured as shown in a plan view of FIG. 2. Although not shown in the figure, the second last-stage CMOS inverter 7 and the dummy CMOS inverter 8 share one P-channel MOS transistor. The size of this P-channel MOS transistor is equal to that of the P-channel MOS transistor of the first last-stage CMOS inverter. In FIG. 2, the reference numerals 21 and 22 designate a source electrode and a source wiring, and the reference numerals 23 and 24 designate a gate electrode and a gate wiring, respectively. The reference numerals 25 and 26 designate drain electrodes, and the reference numeral 27 designates a drain wiring. The drain electrode 25 is connected to the drain wiring 27, and the drain electrode 26 is floating. The reference numerals 28 and 29 designate regions which are formed as the N-channel MOS transistors of the second last-stage CMOS inverter 7 and the dummy CMOS inverter 8, respectively. Namely, the drain electrode on one N-channel MOS transistor is divided, and one of the divided drain electrodes is set to be floating, thereby configuring the N-channel MOS transistors of the second last-stage CMOS inverter 7 and the dummy CMOS inverter 8. A sum of the gate widths W1 and W2 of the N-channel MOS transistors is substantially equal to the gate width W0 of an N-channel MOS transistor which is obtained in the case where the drain electrode is not divided. In the case where the drain electrode is not divided, the size of an N-channel MOS transistor is equal to that of the N-channel MOS transistor of the first last-stage CMOS inverter. When $W_N/W_P=\frac{1}{2}$ for the sake of convenience, by making the gate widths W1 and W2 equal to each other, a ratio of the drivability of the first last-stage CMOS inverter 6 to that of the second last-stage CMOS inverter 7 is set to be 2:1, and equal to the load ratio of 2:1 by the P-channel MOS transistor 1 and the N-channel MOS transistor 2. Furthermore, a sum of the gate capacitances of the MOS transistors constituting the first last-stage CMOS inverter 6 is equal to a sum of the gate capacitances of the second last-stage CMOS inverter 7 and the dummy CMOS inverter 8, and the load of the first amplifier stage 4 is equal to that of the second amplifier stage 5.

According to this configuration, the first and second amplifier stages 4 and 5 can be configured so as to have the same size, and hence the number of CMOS inverters which must be checked in a process of adjusting the duty is reduced. Specifically, checks on each stages of the first and second amplifier stages 4 and 5 are not required and a problematic portion can be identified by conducting checks only on the rear stages of the first and second amplifier stages.

The drivability of the second last-stage CMOS inverter 7 is set by dividing the drain electrode of one N-channel MOS transistor by an appropriate ratio as shown in FIG. 2. Therefore, the drivability of the second last-stage CMOS inverter 7 can be changed without altering the load of the second amplifier stage 5, with the result that the design can be easily changed.

In the embodiment, with respect to the second last-stage CMOS inverter 7 and the dummy CMOS inverter 8, the drain of one N-channel MOS transistor is divided so as to form the N-channel MOS transistors of the inverters, and a P-channel MOS transistor is shared. Alternatively, also the drain of a P-channel MOS transistor may be similarly divided. Also in the alternative, the drains of the P-channel MOS transistor and the N-channel MOS transistor of the dummy CMOS inverter are not connected to each other. In other words, the dummy CMDS inverter remains to be a dummy, and is requested only to equalize the load of the second amplifier stage 5 with that of the first amplifier stage 4. In the dummy CMOS inverter, it is not required to actually connect the drains of the P-channel and N-channel MOS transistors to each other to constitute a CMOS inverter, and to increase an unnecessary through current due to the inverter.

According to the invention, first and second MOS transistors of different conductive types which are connected at the drain to each other are driven by first and second last-stage CMOS inverters driven by first and second amplifier stages, respectively, an output terminal is formed at the node of the drains, an input of a dummy CMOS inverter is connected to a node of the second amplifier stage and the second last-stage CMOS inverter, the load of the second amplifier stage constituted by the second last-stage CMOS inverter and the dummy CMOS inverter is equal to the load of the first amplifier stage constituted by the first last-stage CMOS inverter, and a ratio of the drivability of the first last-stage CMOS inverter to that of the second last-stage CMOS inverter is equal to a ratio of drivabilities of signals which are required for respectively driving the first and second MOS transistors, whereby drivabilities of the CMOS inverters of the same stage in the first and second amplifier stages are made equal to each other.

Therefore, the sizes of the CMOS inverters in respective stages of the first and second amplifier stages can be made equal to each other, and the number of CMOS inverters which must be checked in a process of adjusting the duty can be reduced. Specifically, checks on the stages of the first and second amplifier stages are not required and a problematic portion can be identified by conducting checks only on the rear stages of the first and second amplifier stages. Moreover, the design can be easily changed.

The second last-stage CMOS inverter and the dummy CMOS inverter share one P-channel MOS transistor which is equal in size to the P-channel MOS transistor of the first last-stage CMOS inverter, the drain of the N-channel MOS transistor which is equal in size to the P-channel MOS transistor is divided, whereby N-channel MOS transistors of the second last-stage CMOS inverter and the dummy CMOS inverter are configured, and the drivability of the second last-stage CMOS inverter is set. According to this configuration, the drivability of the second last-stage CMOS inverter can be changed without altering the load of the second amplifier stage, i.e., without changing the sizes of CMOS inverters of each stage of the second amplifier stage, with the result that the design can be easily changed.

What is claimed is:

1. A tristate output circuit comprising:

an output stage including:

a first MOS transistor of a first conductive type;

a second MOS transistor of a second conductive type being able to be driven by a signal that is lower in drivability than a signal by which said first MOS transistor is able to be driven, a drain of the first MOS transistor of the first conductive type and a drain of the second MOS transistor of the second conductive type are connected to each other;

an output terminal disposed at a node of the drains;

a first amplifier stage in which a predetermined number of CMOS inverters having different drivabilities are cascaded in ascending order of drivability;

a second amplifier stage in which the predetermined number of CMOS inverters having different drivabilities are cascaded in ascending order of drivability and the drivability of a CMOS inverter of each stage is set to be equal to that of a CMOS inverter of the corresponding stage of said first amplifier stage;

a first last-stage CMOS inverter connected between said first amplifier stage and said first MOS transistor and, driving said first MOS transistor in response to an output from said first amplifier stage;

a second last-stage CMOS inverter connected between said second amplifier stage and said second MOS transistor and driving said second MOS transistor in response to an output from said second amplifier stage;

a dummy CMOS inverter having an input connected to a node of said second amplifier stage and said second last-stage CMOS inverter; and a control circuit controlling signals respectively supplied to said first and second amplifier stages to set a state of said output terminal of said output stage to be one of a first logic level, a second logic level, and a high impedance, wherein a load of said second amplifier stage defined by said second last-stage CMOS inverter and said dummy CMOS inverter is equal to a load of said first amplifier stage defined by said first last-stage CMOS inverter, and a ratio of the drivability of said first last-stage CMOS inverter to the drivability of said second last-stage CMOS inverter is equal to a ratio of drivabilities of signals which are required for respectively driving said first and second MOS transistors.

2. A tristate output circuit according to claim 1, wherein said first MOS transistor is a P-channel MOS transistor, and said second MOS transistor is an N-channel MOS transistor.

3. A tristate output circuit according to claim 1, wherein a sum of gate widths of MOS transistors defined by said second last-stage CMOS inverter and gate widths of MOS transistors including said dummy CMOS inverter is equal to a gate width of an MOS transistor defined by said first last-stage CMOS inverter.

4. A tristate output circuit according to claim 1, wherein said first MOS transistor is a P-channel MOS transistor, and said second MOS transistor is an N-channel MOS transistor, and a sum of a gate width of an N-channel MOS transistor defined by said second last-stage CMOS inverter and a gate width of an N-channel MOS transistor defined by said dummy CMOS inverter is equal to a gate width of an N-channel MOS transistor defined by said first last-stage CMOS inverter.

5. A tristate output circuit according to claim 4, wherein said second last-stage CMOS inverter and said dummy CMOS inverter share one P-channel MOS transistor, said N-channel MOS transistors of said inverters share a source and a gate, only a drain of said N-channel MOS transistor of said second last-stage CMOS inverter is connected to a drain of said shared P-channel MOS transistor, a drain of said N-channel MOS transistor of said dummy CMOS inverter is set to be floating, said shared P-channel MOS transistor is equal in size to said P-channel MOS transistor of said first last-stage CMOS inverter, and said N-channel MOS transistors of said second last-stage CMOS inverter and said dummy CMOS inverter are equal in size to said N-channel MOS transistor of said first last-stage CMOS inverter, and formed by dividing a drain.

6. A tristate output circuit according to claim 5, wherein drivability of said second last-stage CMOS inverter is set by a ratio of the drain division.

7. A tristate output circuit according to claim 1, wherein said predetermined numbers is an integer of 2 or more.

* * * * *